(12) United States Patent
Hung et al.

(10) Patent No.: US 8,415,179 B2
(45) Date of Patent: Apr. 9, 2013

(54) METHOD FOR MANUFACTURING LIGHT EMITTING DIODE

(75) Inventors: Tzu-Chien Hung, Hsinchu (TW);
Shun-Kuei Yang, Hsinchu (TW);
Chia-Hui Shen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/309,611

(22) Filed: Dec. 2, 2011

(65) Prior Publication Data
US 2012/0273757 A1    Nov. 1, 2012

(30) Foreign Application Priority Data

Apr. 26, 2011    (CN) .......................... 2011 1 0104692

(51) Int. Cl.
*H01L 21/00*    (2006.01)
*H01L 21/302*    (2006.01)
*H01L 21/461*    (2006.01)

(52) U.S. Cl.
USPC .............. 438/22; 438/738; 438/739; 438/745

(58) Field of Classification Search .................... 438/22, 438/39, 689, 701, 738, 739, 745
See application file for complete search history.

(56) References Cited

U.S. PATENT DOCUMENTS 5,972,730 A * 10/1999 Saito et al. ...................... 438/39

* cited by examiner

*Primary Examiner* — Nikolay Yushin
(74) *Attorney, Agent, or Firm* — Altis Law Group, Inc.

(57) ABSTRACT

A light emitting diode and a light emitting diode (LED) manufacturing method are disclosed. The LED comprises a substrate; a first n-type GaN layer; a second n-type GaN layer; an active layer; and a p-type GaN layer formed on the substrate in sequence; the second n-type GaN layers has a bottom surface interfacing with the first n-type GaN layer, a rim of the bottom surface has a roughened exposed portion, and Ga—N bonds on the bottom surface has an N-face polarity.

7 Claims, 9 Drawing Sheets

METHOD FOR MANUFACTURING LIGHT EMITTING DIODE

BACKGROUND

1. Technical Field

The present disclosure relates to semiconductor devices and, particularly, to a light emitting diode and a method for manufacturing the light emitting diode.

2. Description of Related Art

Light emitting diodes (LEDs) have many beneficial characteristics, including low electrical power consumption, low heat generation, long lifetime, small volume, good impact resistance, fast response and excellent stability. These characteristics enable the LEDs to be used as light sources in electrical appliances and electronic devices.

In general, the light output of an LED depends on the quantum efficiency of the active layer and the light extraction efficiency. As the light extraction efficiency increases, the light output of the LED is enhanced. In order to improve the light extraction efficiency, efforts have been made to overcome a significant photon loss resulting from total reflection inside the LED after emission from the active layer.

A typical method for increasing the light extraction efficiency of the LED is to roughen the surface of the LED by etching. However, it may be difficult to roughen the surface of the conventional LED, and the etching process may be time-consuming.

What is needed is an LED and a method for manufacturing the LED which may overcome the disadvantages discussed above.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of the present disclosure will now be described in detail below, with reference to the accompanying drawings.

Figure 1:
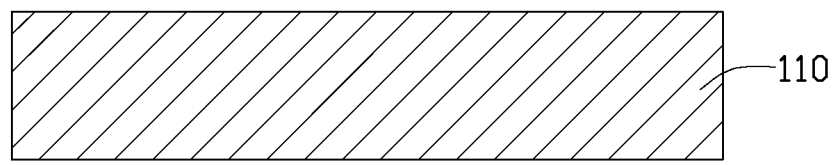
FIG. 1 shows a step of providing a substrate in accordance with a first embodiment of a method for making an LED.

Referring to FIG. 1 wherein a substrate 110 is first provided. The substrate 110 may be made of a material selected from a group consisting of Si, SiC and sapphire.

Figure 2:
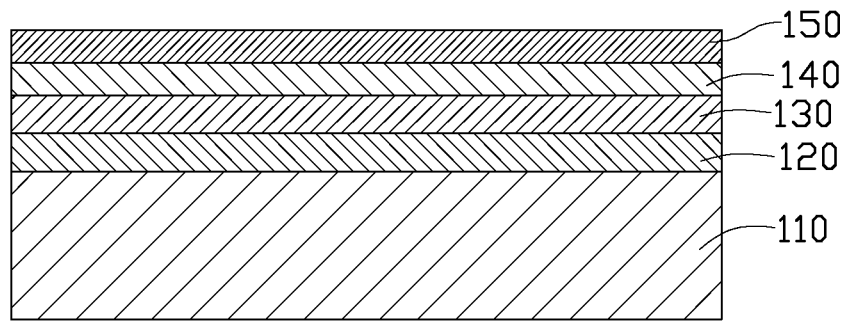
FIG. 2 shows a step of forming a buffer layer, an updoped GaN layer, a first n-type GaN layer and an AlN layer on the substrate in FIG. 1.

Referring also to FIG. 2, a buffer layer 120, an undoped GaN layer 130, a first n-type GaN layer 140 and an AlN layer 150 are formed on the substrate 110 in sequence. A thickness of the AlN layer 150 ranges from 5 nm to 500 nm. If the thickness of the AlN layer 150 is less than 5 nm, the AlN layer 150 may not be easily removed by etching solution. If the thickness of the AlN layer 150 is larger than 500 nm, a GaN layer formed above the AlN layer 150 in following steps may be cracked due to different lattice constants between the GaN layer and the AlN layer 150. In this embodiment, the thickness of the AlN layer 150 is about 50 nm. In this embodiment, the buffer layer 120 and the updoped GaN layer 130 are configured to improve the quality of the first n-type GaN layer 140. In alternative embodiments, the first n-type GaN layer 140 may be directly formed on the buffer layer 120, or directly formed on the substrate 110. The first n-type GaN layer 140 has a first surface 1400 away from the substrate 110. The first surface 1400 of the first n-type GaN layer 140 has a Ga-face polarity, in which Ga atoms are formed on an upper surface of a GaN lattice structure. In contrast, an N-face polarity means that N atoms are formed on an upper surface of the GaN lattice structure. A GaN layer having N-face polarity can be easily etched by alkaline solution under a temperature less than 100 degrees centigrade, and a GaN layer having Ga-face polarity is hard to react with alkaline solution under a temperature less than 100 degrees centigrade.

Figure 3:
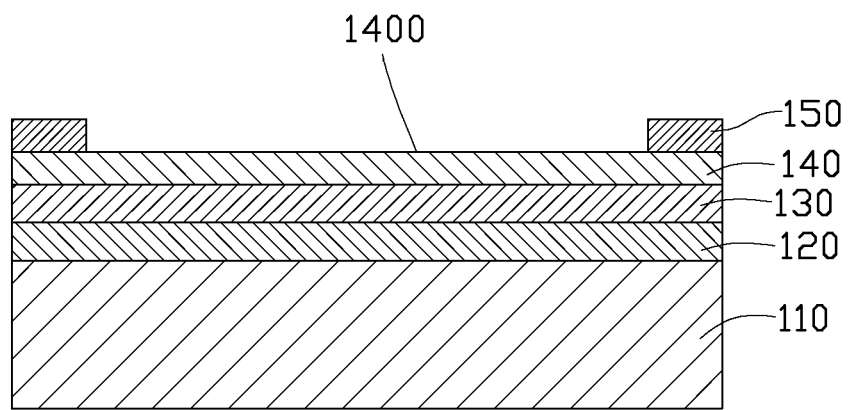
FIG. 3 shows a step of patterning of the AlN layer in FIG. 2.
Figure 4:
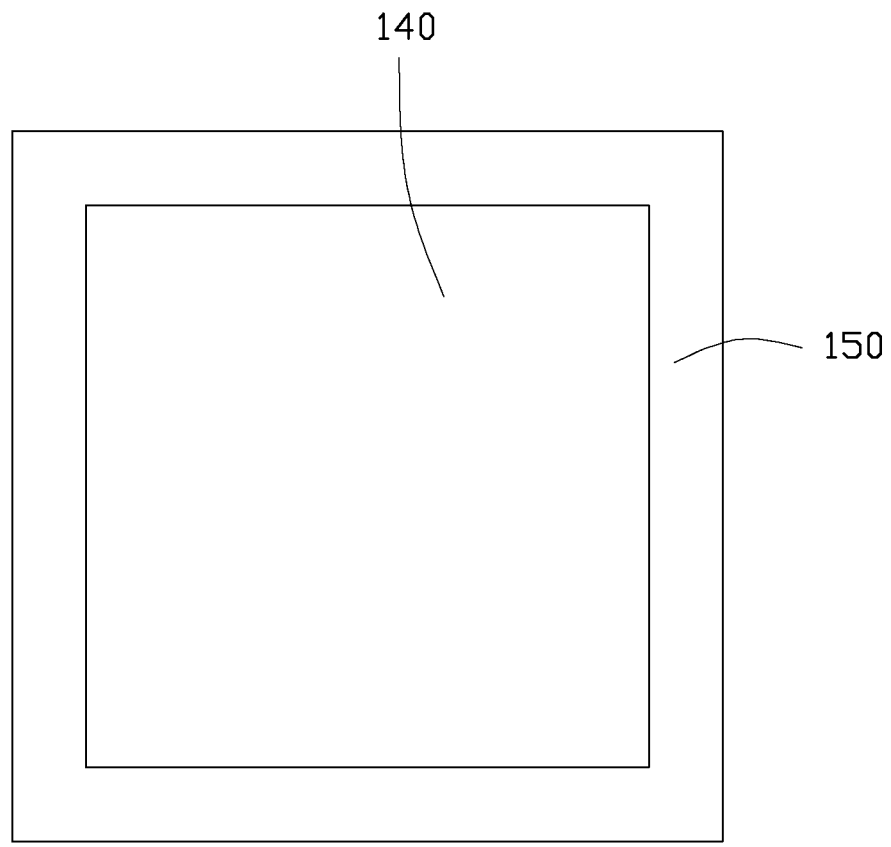
FIG. 4 shows a top view of the AlN layer after patterning in FIG. 3.

Referring to FIG. 3, a middle portion of the AlN layer 150 is removed by inductively coupled plasma (ICP) technology, thereby exposing a middle region of the first surface 1400 of the first n-type GaN layer 140, and a remaining portion of the AlN layer 150 covering a rim of the first surface 1400 of the first n-type GaN layer 140. Referring also to FIG. 4, the AlN layer 150 is rectangular shaped in this embodiment.

Figure 5:
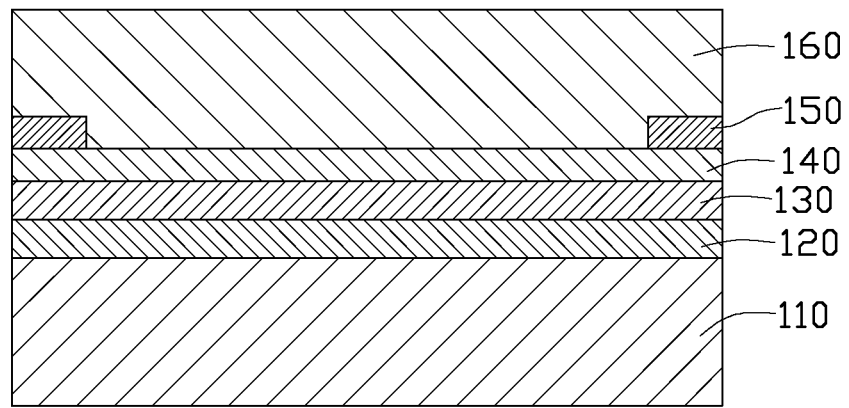
FIG. 5 shows a step of forming a second n-type GaN layer on an upper surface of the first n-type GaN layer uncovered by the AlN layer in FIG. 3.

Referring to FIG. 5, a second n-type GaN layer 160 is formed on the first n-type GaN layer 140. The second n-type GaN layer 160 not only covers the middle portion of the first surface 1400 uncovered by the AlN layer 150, but also totally covers the AlN layer 150. A bottom surface of the second n-type GaN layer 160 facing the first n-type GaN layer 140 has an N-face polarity; therefore it can be easily etched by alkaline solution. A thickness of the second n-type GaN layer 160 ranges from 300 nm to 500 nm.

Figure 6:
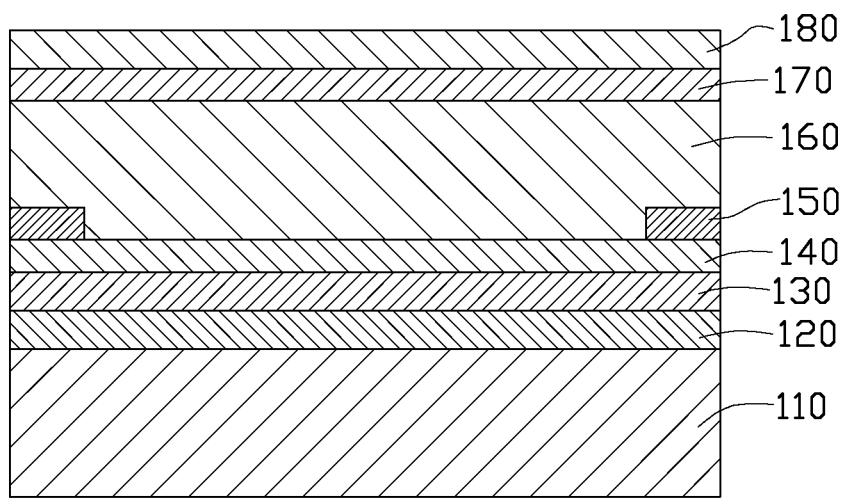
FIG. 6 shows a step of forming an active layer and a p-type GaN layer on an upper surface of the second n-type GaN layer in FIG. 5.

Referring to FIG. 6, an active layer 170 and a p-type GaN layer 180 are formed on an upper surface of the second n-type GaN layer 160, in sequence. In this embodiment, the active layer 170 is an InGaN/GaN multiple quantum well structure.

Figure 7:
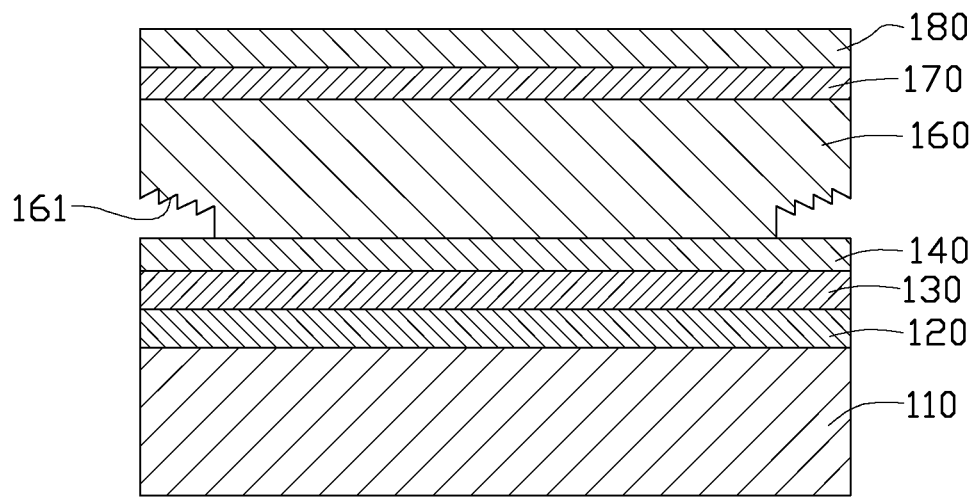
FIG. 7 shows a step of etching the AlN layer and the second n-type GaN layer in FIG. 6 by alkaline solution.

Referring to FIG. 7, alkaline solution is used to remove the AlN layer 150, thereby exposing a portion of the bottom surface of the second n-type GaN layer 160. Then the alkaline solution is used to etch and roughen the portion of the bottom surface of the second n-type GaN layer 160. An annular roughened portion 161 thus is formed on the bottom surface of the second n-type GaN layer 160. In order to accelerate the etching, the alkaline solution may be strong alkaline solution, such as KOH solution and NaOH solution, etc. In this embodiment, the AlN layer 150 and the second n-type GaN layer 160 are etched by KOH solution under a temperature of 85 degrees centigrade for 30 to 60 minutes.

Figure 8:
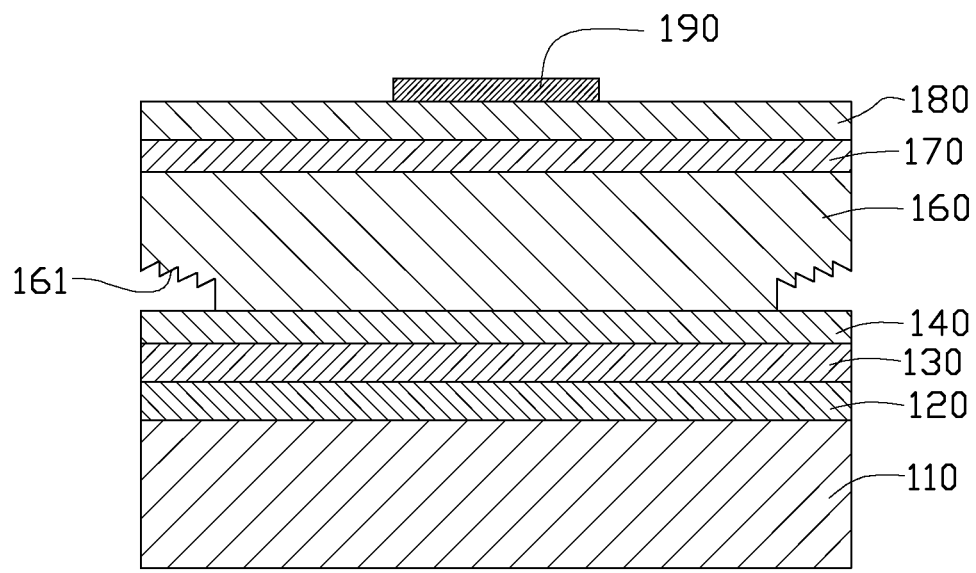
FIG. 8 shows a step of forming an electrode on an upper surface of the p-type GaN layer.

Referring to FIG. 8, an electrode 190 is formed on the p-type GaN layer 180. The electrode 190 is made of a material selected from a group consisting of Au, Ag, Cu, Al, Sn, Ni, Co, and alloys thereof. In this embodiment, the electrode 190 is formed on the p-type GaN layer 180 by sputtering or vacuum evaporating. As shown in FIG. 8, an LED comprises the substrate 110, the buffer layer 120, the undoped GaN layer 130, the first n-type GaN layer 140, the second n-type GaN layer 160, the active layer 170, the p-type GaN layer 180 and the electrode 190 sequentially formed on the substrate 110. The second n-type GaN layer 160 comprises the annular roughened portion 161 formed on the rim of the bottom surface thereof, wherein the annular roughened portion 161 has an N-face polarity. Facets of the annular roughened portion 161 may reflect back light from the active layer 170, thereto increase the light extraction efficiency of the LED.

Because the AlN layer 150 is easily removed by alkaline solution, the alkaline solution may penetrate into an interface between the first n-type GaN layer 140 and the second n-type GaN layer 160, and may preferentially etch, or roughen, the bottom surface of the second n-type GaN layer 160 which has an N-face polarity. Therefore, the roughening of the bottom surface of the second n-type GaN layer 160 may be accelerated. Also, the second n-type GaN layer 160 is directly grown on the first n-type GaN layer 140, and the AlN layer 150 surrounds the bottom surface of the second n-type GaN layer 160. After the AlN layer 150 is removed, the second n-type GaN layer 160 is still connected with the first n-type GaN layer 140. As a result, removal of the AlN layer 150 will not affecting electrical connections between the first n-type GaN layer 140 and the second n-type GaN layer 160.

Figure 9:
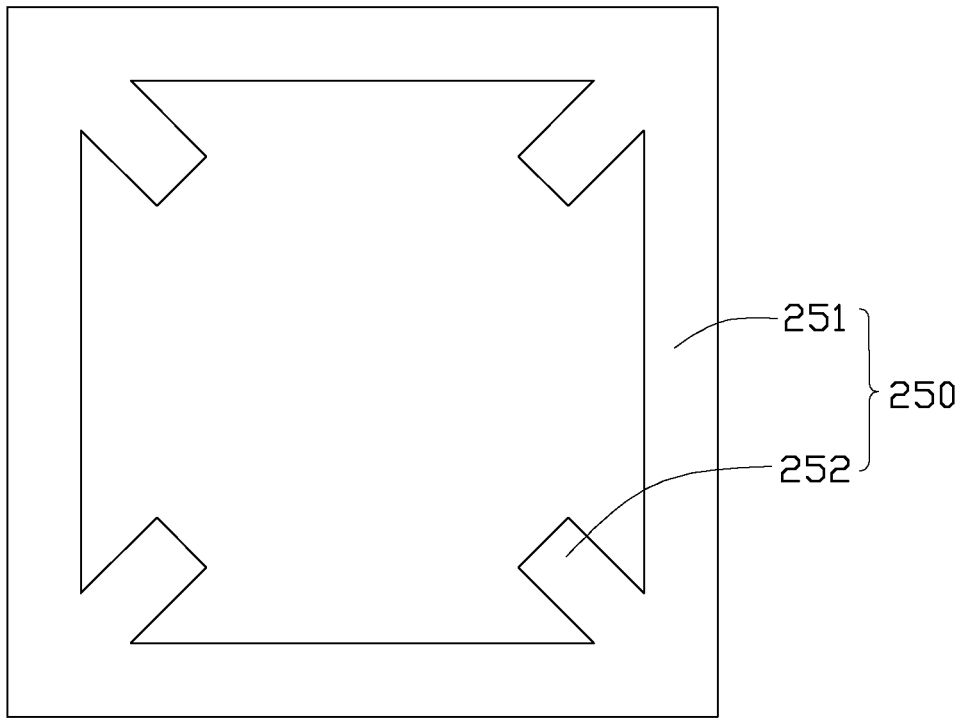
FIG. 9 shows a top view of a patterned AlN layer in accordance with a second embodiment.

In alternative embodiments, the AlN layer may not be limited to rectangular shaped as shown in FIG. 4. Referring to FIG. 9, an AlN layer 250 in accordance with a second embodiment includes an annular portion 251 and a plurality of finger portions 252 extending inwardly from the annular portion 251. In this embodiment, the annular portion 251 has a rectangle shape and the plurality of finger portions 252 extending inwardly from four corners of the annular portion 251. The AlN layer 250 of the second embodiment may replace the AlN layer 150 of the first embodiment. When the AlN layer 250 is etched by alkaline solution, the alkaline solution may penetrate deep inside the LED from the annular portion 251 to the plurality of finger portions 252. As a result, roughened surfaces with light reflecting facets between the first and second n-type GaN layers may be further increased, according to the second embodiment of the present disclosure. An increased area of roughened surfaces of the second n-type GaN layer may further improve light extracting efficiency.

While certain embodiments have been described and exemplified above, various other embodiments will be apparent to those skilled in the art from the foregoing disclosure. The disclosure is not limited to the particular embodiments described and exemplified, and the embodiments are capable of considerable variation and modification without departure from the scope and spirit of the appended claims.

What is claimed is:

1. An LED manufacturing method comprising:
providing a substrate;
forming a first n-type GaN layer on the substrate;
forming an AlN layer on the first n-type GaN layer,
creating a pattern of the AlN layer around a rim of an upper surface of the first n-type GaN layer, removing the AlN layer from a middle region of the upper surface of the first n-type GaN layer, and exposing the middle region of the upper surface of the first n-type GaN layer;
forming a second n-type GaN layer on the middle region of the upper surface of the first n-type GaN layer uncovered by the AlN layer, overlapping the second n-type GaN layer laterally with the AlN layer, creating an N-face polarity interface on a bottom surface of the second n-type GaN layer interfacing with the first n-type GaN layer;
forming an active layer and a p-type GaN layer on an upper surface of the second n-type GaN layer in sequence;
etching away a patterned AlN layer around the rim of the bottom face of the second n-type GaN layer with an alkaline solution; exposing the rim of the bottom surface of the second n-type GaN layer; forming roughened surfaces around the rim on the bottom surface of the second n-type GaN layer interfacing with the first n-type GaN layer with the alkaline solution to form a roughened surface; and
forming an electrode on an upper surface of the p-type GaN layer.

2. The LED manufacturing method as in claim 1, further comprising selecting the alkaline solutions from KOH solutions, or NaOH solutions.

3. The LED manufacturing method as in claim 1, wherein the etching of the AlN layer and the second n-type GaN layer by an alkaline solution is under a temperature of 85 degrees centigrade for 30 to 60 minutes.

4. The LED manufacturing method as in claim 1, the forming the AlN layer further comprises forming a thickness of the AlN layer ranges from 5 nm to 500 nm.

5. The LED manufacturing method as in claim 1, the forming the AlN layer further comprises forming the AlN layer in an annular pattern and surrounding the bottom surface of the second n-type GaN layer.

6. The LED manufacturing method as in claim 1, the forming the AlN layer further comprises forming an annular portion and a plurality of finger portions extending inwardly from the annular portion of the AlN layer to a center portion of the upper surface of the first n-type GaN layer.

7. The LED manufacturing method as in claim 1, the forming the AlN layer further comprises using inductively coupled plasma technology to remove a center portion of the AlN layer, and maintaining an edge portion of the AlN layer intact around a rim of the upper surface of the first n-type GaN layer.

* * * * *